(12) United States Patent
Zhang et al.

(10) Patent No.: US 10,590,953 B2
(45) Date of Patent: Mar. 17, 2020

(54) AXIAL FLOW FAN AND ELECTRONIC DEVICE

(71) Applicant: CHAMP TECH OPTICAL (FOSHAN) CORPORATION, Foshan (CN)

(72) Inventors: Yong-Kang Zhang, Foshan (CN); Yung-Ping Lin, New Taipei (TW)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 54 days.

(21) Appl. No.: 15/629,939

(22) Filed: Jun. 22, 2017

(65) Prior Publication Data

US 2018/0291924 A1    Oct. 11, 2018

(30) Foreign Application Priority Data

Apr. 10, 2017    (CN) .......................... 2017 1 0230508

(51) Int. Cl.
*F04D 29/44* (2006.01)
*F04D 29/52* (2006.01)
*H02K 7/14* (2006.01)

(52) U.S. Cl.
CPC ............. *F04D 29/526* (2013.01); *H02K 7/14* (2013.01); *H05K 2201/09027* (2013.01); *H05K 2201/1009* (2013.01); *H05K 2201/10689* (2013.01)

(58) Field of Classification Search
CPC ...... F04D 29/516; F04D 19/00; F04D 19/002; H02K 7/14; H05K 2201/10689; H05K 2201/09027; H05K 2201/1099

USPC .......................................................... 415/206
See application file for complete search history.

(56) References Cited

U.S. PATENT DOCUMENTS

| | | | | |
|---|---|---|---|---|
| 9,841,035 | B2 * | 12/2017 | Wu ........................ | F04D 29/522 |
| 2004/0012923 | A1 * | 1/2004 | Chen ........................ | G06F 1/203 |
| | | | | 361/679.54 |
| 2013/0251559 | A1 * | 9/2013 | Taroda .................. | F04D 19/002 |
| | | | | 417/410.1 |
| 2014/0010681 | A1 * | 1/2014 | Wang .................. | F04D 25/0613 |
| | | | | 417/354 |
| 2015/0337860 | A1 * | 11/2015 | Ho ........................ | F04D 27/008 |
| | | | | 416/90 R |
| 2016/0051922 | A1 * | 2/2016 | Horng .................... | B01D 46/42 |
| | | | | 55/471 |
| 2016/0312792 | A1 * | 10/2016 | Fujimaki ................. | F04D 25/08 |
| 2016/0327057 | A1 * | 11/2016 | Wu ........................ | F04D 29/522 |

FOREIGN PATENT DOCUMENTS

| | | |
|---|---|---|
| CN | 100353077 C | 12/2007 |
| CN | 103133419 A | 6/2013 |
| CN | 106194844 A | 12/2016 |
| TW | 201702486 A | 1/2017 |
| WO | 2004046557 A1 | 6/2004 |

* cited by examiner

*Primary Examiner* — Long T Tran
*Assistant Examiner* — James J Kim
(74) *Attorney, Agent, or Firm* — ScienBiziP, P.C.

(57) ABSTRACT

An axial flow fan includes a fan frame and an impeller received in the fan frame. The fan frame includes a base shell and a flange being formed on the base shell. The base shell further includes an air inlet facing away from the flange. The flange includes a first air outlet. The flange further includes a second air outlet. Air flows through the second air outlet in a direction perpendicular to the air flowing through the first air outlet.

19 Claims, 5 Drawing Sheets

AXIAL FLOW FAN AND ELECTRONIC DEVICE

FIELD

The subject matter generally relates to a fan, and more particularly, to an axial flow fan and an electronic device with the axial flow fan.

BACKGROUND

Heat generating components, such as central processing units (CPUs), often generate heat when in operation. In an electronic device that uses the heat generating component, an axial flow fan is often used to dissipate heat.

For the axial flow fan, air usually flows through the air inlet and air outlet in a same direction. If the air outlet is blocked, the heat cannot be effectively dissipated. Improvements in the art is preferred.

BRIEF DESCRIPTION OF THE DRAWINGS

Implementations of the present technology will now be described, by way of example only, with reference to the attached figures.

DETAILED DESCRIPTION OF EMBODIMENTS

Figure 1:
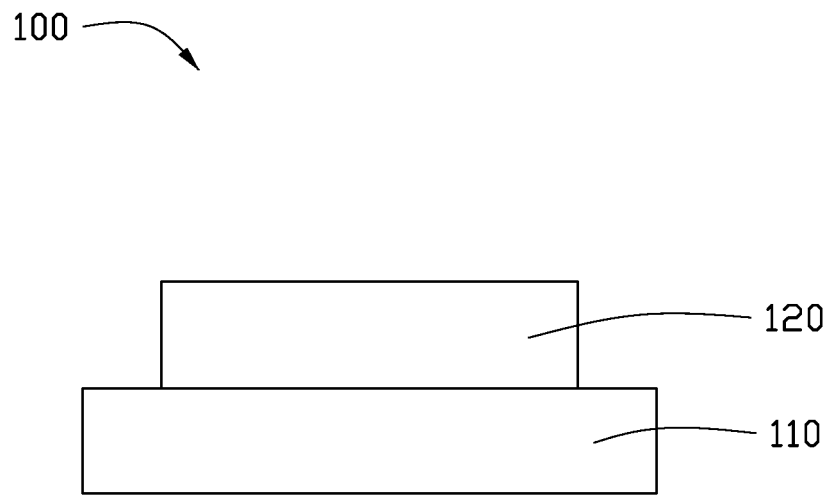
FIG. 1 is a side view of an exemplary embodiment of an electronic device with an axial flow fan of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

The term "comprising," when utilized, means "including, but not necessarily limited to"; it specifically indicates open-ended inclusion or membership in the so-described combination, group, series and the like.

FIGS. 1-5 illustrate an exemplary embodiment of an electronic device 100. The electronic device 100 includes an axial flow fan 110 and an electronic component 120 facing the axial flow fan 110. The axial flow fan 110 is used to dissipate heat from the electronic component 120.

Figure 2:
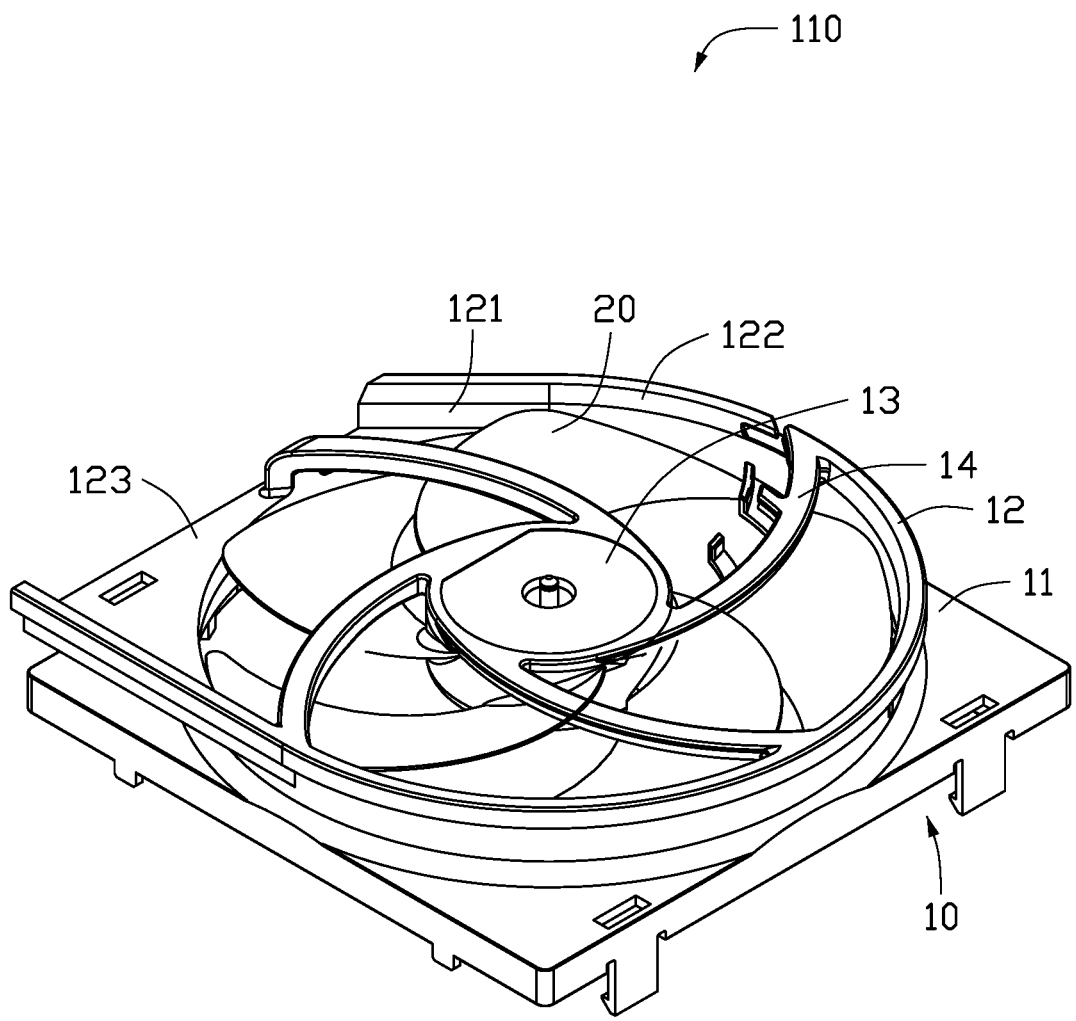
FIG. 2 is a diagram of the axial flow fan in FIG. 1.

In FIG. 2, the axial flow fan 110 includes a fan frame 10 and an impeller 20 received in the fan frame 10.

The fan frame 10 includes a base shell 11 and a substantially circular flange 12 formed on the base shell 11. The base shell 11 includes a first surface 111. The flange 12 protrudes from the first surface 111.

Figure 3:
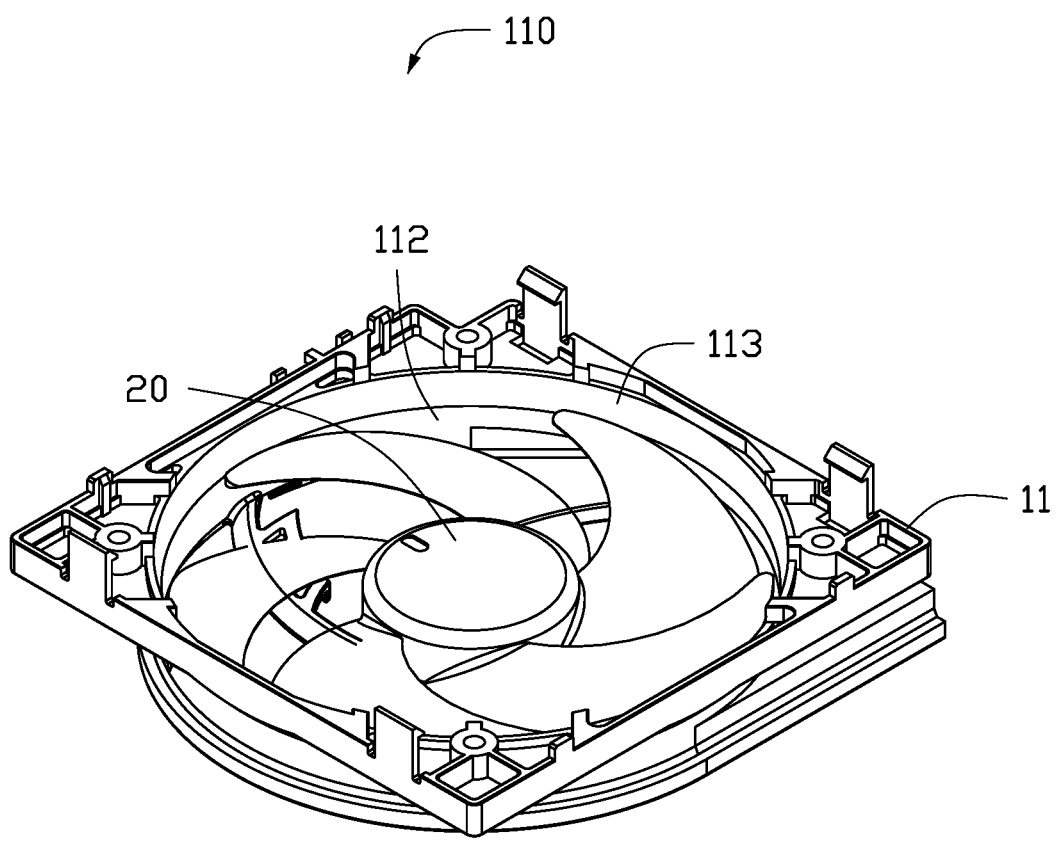
FIG. 3 is similar to FIG. 2, but showing the axial flow fan from another angle.

In FIG. 3, the base shell 11 defines a first housing space 112 and an air inlet 113. The air inlet 113 is in air communication with the first housing space 112. The air inlet 113 is defined to face away from the flange 12.

Figure 4:
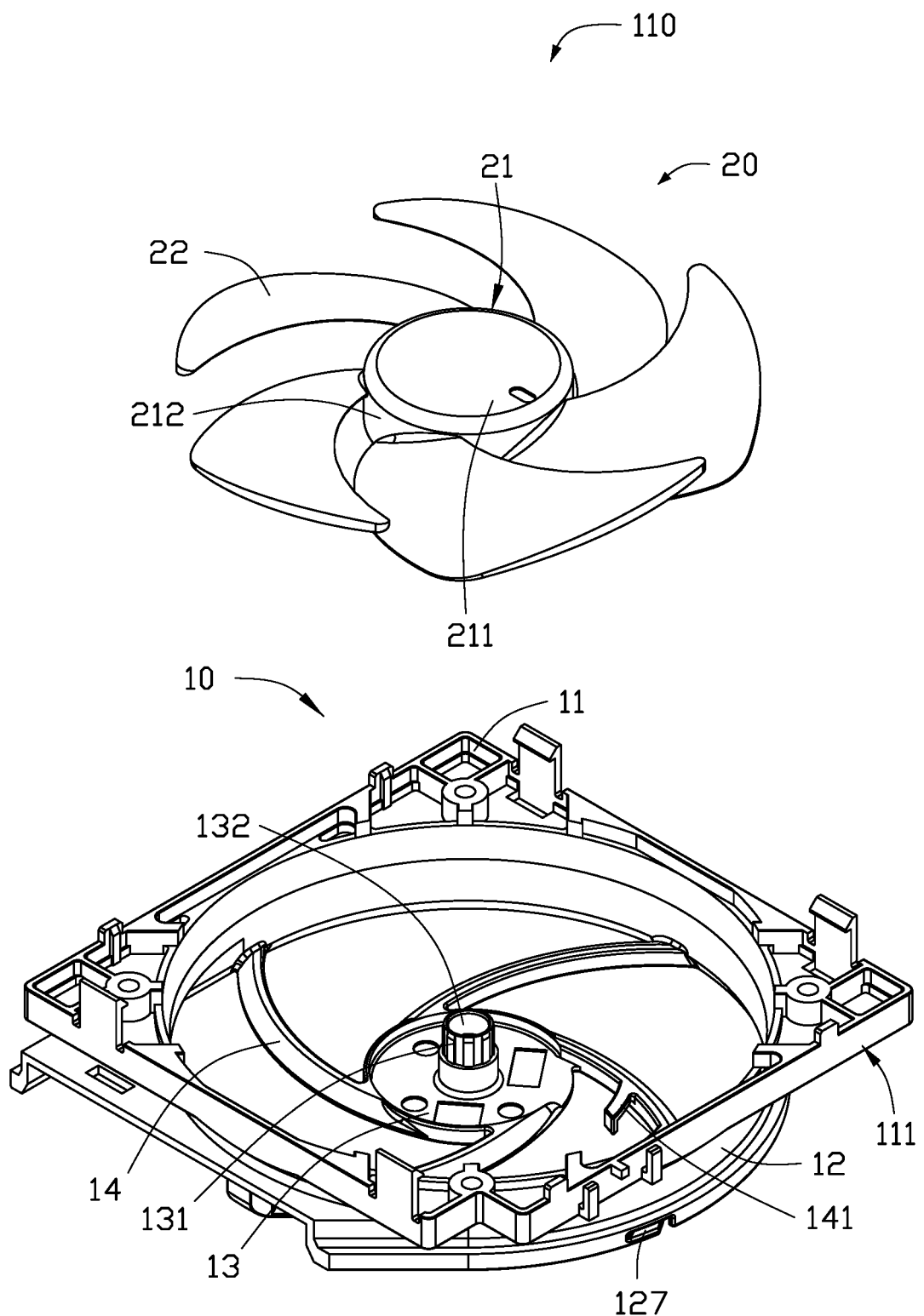
FIG. 4 is an exploded view of the axial flow fan in FIG. 3.
Figure 5:
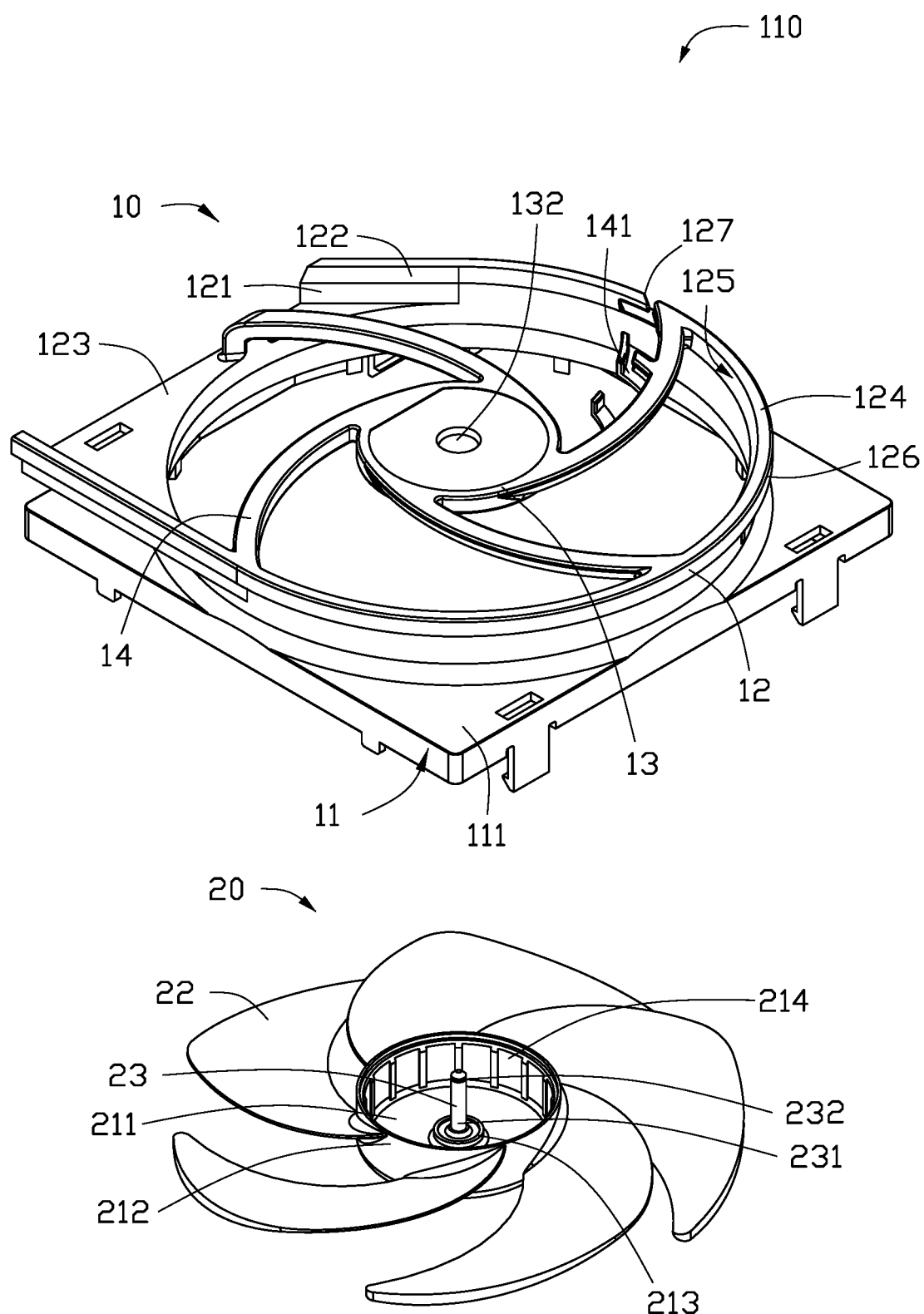
FIG. 5 is similar to FIG. 4, but showing the axial flow fan from another angle.

In FIG. 4, the flange 12 defines a second housing space 121 in air communication with the first housing space 112, a first air outlet 122 in air communication with the second housing space 121, and a second air outlet 123 in air communication with the first air outlet 122. The impeller 20 is received in the first housing space 112 and the second housing space 121 as shown in FIG. 3. Referring to FIGS. 3 and 5, air flowing through the air inlet 113 in a same direction as air flowing through the first air outlet 122. Air flows through the second air outlet 123 in a direction perpendicular to the air flowing through the first air outlet 122.

In FIG. 5, the flange 12 further includes a top surface 124, an inner surface 125, and an outer surface 126. The top surface 124 faces away from the first surface 111. The inner surface 125 faces away from the outer surface 126. The inner surface 125 and the outer surface 126 connect the top surface 124 to the first surface 11. The second air outlet 123 is defined through the top surface 124, the inner surface 125, and the outer surface 126.

At least one opening 127 is defined on the flange 12.

In at least one exemplary embodiment, the opening 127 is defined through the top surface 124, the inner surface 125, and the outer surface 126.

A base 13 is formed in the second housing space 121.

In at least one exemplary embodiment, the base 13 is substantially cylindrical in shape.

In, FIG. 4, a central protrusion 131 protrudes from a center area of the base 13.

In at least one exemplary embodiment, the central protrusion 131 and the base 13 are integrally formed.

In at least one exemplary embodiment, the central protrusion 131 is hollow and cylindrical.

A housing hole 132 is defined in the central protrusion 131.

In at least one exemplary embodiment, the housing hole 132 is defined through the central protrusion 131 and the base 13.

In another exemplary embodiment, the housing hole 132 is only defined through the central protrusion 131. In other exemplary embodiments, the housing hole 132 is a blind hole.

A plurality of connecting components 14 protrudes from a peripheral surface of the base 13 to the inner surface 125 of the flange 12. The connecting components 14 are symmetrical relative to the base 13. A guiding part 141 is formed on at least one of the connecting components 14, which can guide the power wire (not shown) towards the opening 127. The guiding part 141 has an extending direction same as the connecting component 14.

In at least one exemplary embodiment, the guiding part 141 and the connecting components 14 are curved in shape.

In at least one exemplary embodiment, the connecting components 14 are ribs.

In at least one exemplary embodiment, an end of at least one the connecting components 14 extends to the second air outlet 123 and is mounted in air communication with the first surface 111 of the base shell 11.

In other exemplary embodiment, the connecting components 14 can also be spaced from the second air outlet 123.

In at least one exemplary embodiment, the number of the connecting component 14 is four. In other exemplary embodiment, the number of the connecting components 14 can also be varied.

In FIGS. 4 and 5, the impeller 20 includes a hub 21, a number of blades 22, and a rotating shaft 23. The blades 22 radially extend outwards from the rim of the hub 21.

The hub 21 includes a circular top wall 211 and a cylindrical sidewall 212 vertically extending away from the rim of the top wall 211. A rotating base 213 is formed on a surface of the top wall 211. The rotating shaft 23 includes a mounted end 231 and a free end 232 facing away from the mounted end 231. The mounted end 231 is mounted on the rotating base 213. The free end 232 is received in the housing hole 132. The top wall 211 and the side wall 212 cooperatively define a third housing space 214. The central protrusion 131 is received in the third housing space 214.

The axial flow fan 110 further includes a motor (not shown). The motor is received in the third housing space 214. The motor is used to drive the rotating shaft 23 to rotate, thereby driving the blades 22 to rotate.

When in operation, the impeller 20 drives air surrounding the impeller 20 to rotate and to generate airflow. The airflow enters the fan frame 10 through the air inlet 113, and then exits the fan frame 10 through the first air outlet 122 and the second air outlet 123.

With the above configuration, the second air outlet 123 can improve heat dissipation efficiency of the axial flow fan 110, and can further prevent the heat generated by the electronic component 120 from being stored in the axial flow fan 110 when the first air outlet 122 is blocked.

The embodiments shown and described above are only examples. Many details are often found in the art such as the other features of the lead frame and light emitting diode package having the same. Therefore, many such details are neither shown nor described. Even though numerous characteristics and advantages of the present technology have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. An axial flow fan comprising:
a fan frame, the fan frame comprising a base shell and a flange formed on the base shell, the base shell comprising an air inlet facing away from the flange, the flange comprising a first air outlet and a second air outlet, wherein air flows through the second air outlet in a direction perpendicular to the air flowing through the first air out let;
an impeller received in the fan frame; and
a base, wherein the base is mounted to the flange by a plurality of connecting components; at least one end of each of the connecting components extends to the second air outlet and is mounted on the first surface of the base shell.

2. The axial flow fan of claim 1, wherein the base shell further defines a first housing space, the impeller is received in the first housing space, and the air inlet is in air communication with first housing space.

3. The axial flow fan of claim 2, wherein the flange defines a second housing space in air communication with the first housing space, and the impeller is received in the first housing space and the second housing space.

4. The axial flow fan of claim 3, wherein the first air outlet is in air communication with the second housing space.

5. The axial flow fan of claim 1, wherein the second air outlet is in air communication with the first air outlet.

6. The axial flow fan of claim 1, wherein air flows through the air inlet in a same direction as the air flowing through the first air outlet.

7. The axial flow fan of claim 1, wherein the base shell comprises a first surface, the flange protrudes from the first surface.

8. The axial flow fan of claim 7, wherein the flange further comprises a top surface, an inner surface, and an outer surface, the top surface faces away from the first surface, the inner surface faces away from the outer surface, the inner surface and the outer surface connect the top surface and the first surface.

9. The axial flow fan of claim 8, wherein the axial flow fan further comprises a base, and the base is mounted to the inner surface of the flange by the plurality of connecting components.

10. The axial flow fan of claim 9, wherein the plurality of connecting components are symmetrical relative to the base.

11. The axial flow fan of claim 9, wherein at least one opening is defined in the flange, the at least one opening is defined through the flange.

12. The axial flow fan of claim 11, wherein a guiding part is formed on at least one of the connecting components, the at least one of the connecting component guides a power wire towards the opening.

13. The axial flow fan of claim 12, wherein the guiding part has a same extending direction as the connecting component.

14. The axial flow fan of claim 12, wherein the connecting components are ribs.

15. The axial flow fan of claim 12, wherein the guiding part and the connecting components are curved in shape.

16. The axial flow fan of claim 9, further comprising a central protrusion, wherein the central protrusion protrudes from a center area of the base; a housing hole is defined in the central protrusion; wherein the impeller comprises a hub, a plurality of blades, and a rotating shaft; wherein the blades radially extend outwards from a rim of the hub; the hub comprises a top wall and a cylindrical sidewall vertically extending away from a rim of the top wall; wherein a rotating base is formed on the top wall, the rotating shaft comprises a mounted end and a free end facing away from the mounted end, the mounted end is mounted on the rotating base, the free end is received in the housing hole; wherein the top wall and the side wall cooperatively define a third housing space, and the central protrusion is received in the third housing space.

17. An electronic device comprising:
a fan frame, the fan frame comprising a base shell and a flange formed on the base shell, the base shell comprising an air inlet facing away from the flange, the flange comprising a first air outlet and a second air outlet, wherein air flows through the second air outlet in a direction perpendicular to the air flowing through the first air outlet;

an impeller received in the fan frame, and a base, wherein the base is mounted to the flange by a plurality of connecting components; at least one end of each of the connecting components extends to the second air outlet and is mounted on the first surface of the base shell; and an electronic component, the electronic component facing the axial flow fan.

18. The electronic device of claim 17, wherein the base shell further defines a first housing space, the impeller is received in the first housing space; the air inlet is in air communication with first housing space; the flange defines a second housing space in air communication with the first housing space, the impeller is received in the first housing space and the second housing space, the first air outlet is in air communication with the second housing space.

19. The electronic device of claim 17, wherein the second air outlet is in air communication with the first air outlet, air flows through the air inlet in a same direction as the air flowing through the first air outlet.

\* \* \* \* \*